US008026921B2

(12) United States Patent
Beuker

(10) Patent No.: US 8,026,921 B2
(45) Date of Patent: Sep. 27, 2011

(54) DRIVING METHOD, DRIVING CIRCUIT AND DRIVING APPARATUS FOR A DISPLAY SYSTEM

(75) Inventor: Rob Anne Beuker, Eindhoven (NL)

(73) Assignee: Trident Microsystems (Far East) Ltd., Grand Cayman (KY)

( * ) Notice: Subject to any disclaimer, the term of this patent is extended or adjusted under 35 U.S.C. 154(b) by 919 days.

(21) Appl. No.: 10/527,098

(22) PCT Filed: Aug. 6, 2003

(86) PCT No.: PCT/IB03/03519

§ 371 (c)(1),
(2), (4) Date: Mar. 9, 2005

(87) PCT Pub. No.: WO2004/023453

PCT Pub. Date: Mar. 18, 2004

(65) Prior Publication Data

US 2006/0033726 A1 Feb. 16, 2006

(30) Foreign Application Priority Data

Sep. 9, 2002 (EP) .................................... 02078657

(51) Int. Cl.

| | |
|---|---|
| ***G06F 12/00*** | (2006.01) |
| ***G06F 12/06*** | (2006.01) |
| ***G06F 13/28*** | (2006.01) |
| ***G06F 3/038*** | (2006.01) |
| ***G06F 9/26*** | (2006.01) |
| ***G09G 5/36*** | (2006.01) |
| ***G11C 8/00*** | (2006.01) |

(52) U.S. Cl. ........ 345/564; 345/572; 345/547; 345/533; 345/204; 365/230.09; 365/236; 711/217; 711/218; 711/220; 711/221

(58) Field of Classification Search .................. 345/204, 345/533, 537–538, 545, 547, 564, 566, 572–574; 365/230.01, 230.09, 236, 239; 711/217–218, 711/220–221; 348/585
See application file for complete search history.

(56) References Cited

U.S. PATENT DOCUMENTS

| | | | | |
|---|---|---|---|---|
| 5,170,251 | A | | 12/1992 | Levy |
| 5,585,863 | A | * | 12/1996 | Hackett et al. ................ 348/716 |
| 5,587,962 | A | * | 12/1996 | Hashimoto et al. ....... 365/230.09 |
| 5,781,903 | A | | 7/1998 | Rusterholz |
| 5,784,331 | A | | 7/1998 | Lysinger |
| 5,864,838 | A | | 1/1999 | Rusterholz |

(Continued)

FOREIGN PATENT DOCUMENTS

| | | |
|---|---|---|
| CN | 1049926 | 3/1991 |
| EP | 0410743 | 1/1991 |
| GB | 2176979 | 1/1987 |

(Continued)

*Primary Examiner* — Xiao M Wu
*Assistant Examiner* — Tize Ma
(74) *Attorney, Agent, or Firm* — DLA Piper LLP (US)

(57) ABSTRACT

A table-based driving circuit for displays that switches between a normal operational mode and a read table block mode. The driving circuit comprises an address sequencer and a memory. The memory comprises the full table of individual sequences, such as interlacing or color-sequential sequence. In the read table mode, the next upcoming addresses are read, i.e. are downloaded, from the memory into an address table register in the address sequencer. In the normal operational mode, the address sequencer generates the addresses for the video data to be stored in the memory or to be displayed.

18 Claims, 6 Drawing Sheets

U.S. PATENT DOCUMENTS

| | | | | | |
|---|---|---|---|---|---|
| 5,973,664 | A * | 10/1999 | Badger | ......................... | 345/659 |
| 6,356,314 | B1 | 3/2002 | Takebe | | |
| 6,608,626 | B2 * | 8/2003 | Chan | ............................. | 345/572 |
| 6,819,326 | B2 * | 11/2004 | Jaspers | ......................... | 345/568 |
| 6,904,473 | B1 * | 6/2005 | Bloxham et al. | ................ | 710/22 |

FOREIGN PATENT DOCUMENTS

| | | |
|---|---|---|
| JP | 1-266593 | 10/1989 |
| JP | 2001-527662 | 10/1989 |
| JP | 07-271345 | 10/1995 |
| WO | WO 98/40874 | 9/1998 |

* cited by examiner

DRIVING METHOD, DRIVING CIRCUIT AND DRIVING APPARATUS FOR A DISPLAY SYSTEM

PRIORITY CLAIMS/RELATED APPLICATIONS

This application is a 371 U.S. national stage filing of (and claims the benefit and priority to under 35 USC 119 and 120) PCT/IB2003/003519 filed on Aug. 6, 2003 which in turn claims the benefit of and priority under 35 USC 119 to European Patent Application Serial No. 02078657.0 filed on Sep. 9, 2002.

The invention relates to a method of operating a driving circuit for a display system, wherein a sequence of writing and/or reading video data in to and/or from a memory is controlled by means of an address sequencer, each of the memory addresses for said video data generated in the address sequencer being composed of a picture line address part or line pointer and an address part for a pixel on said picture line.

This method is applied in display systems such as Cathode Ray Tubes (CRT), Plasma Discharge Panels (PDP), Liquid Crystal Displays (LCD), and one-panel Liquid Crystal on Silicon (LCOS). All of them require different addressing sequences. Frame memories are widely used as driving circuits for these display systems. External or embedded static or dynamic random access memories (SRAM's or DRAM's) are often used as frame memories for re-ordering video information. Sequencers normally control the order of reading and writing. If the driving circuit is supposed to work with different resolutions, e.g. zooming or split-screen monitoring, or is to be able to drive different kinds of the above-mentioned displays, a flexible addressing of the frame memory is needed for re-ordering pixel data. In particular, the driving circuit must be flexible enough to generate sequences such as interlaced sequences and color sequential sequences, and flexible enough to handle design changes, for example in the optical layout of the LCOS system.

A possible solution may be found in the design of the sequencer in the form of a number of counters combined with logic. However, the difficulty thereof is that this is basically a non-flexible solution. The different sequences to be produced have to be known in advance to guarantee a coverage of all required solutions.

Another possible solution may be a sequence table approach, wherein the whole sequence is stored into a random access memory that is part of the sequencer. This solution offers all the required flexibility in principle. Such a solution is known from U.S. Pat. No. 5,587,962. This patent specification discloses a device with a frame memory circuit which permits limited random access and is used to perform a wide variety of special-effect video applications. The frame memory circuit of this device stores and provides streams of data and supports both serial access and random access. A data input of a random access memory array couples to a data buffer, so that the data buffer may synchronize operation of the memory array with the streams of data. An address input of the random access memory array couples to one address sequencer, which generates a sequence of memory addresses that are successively applied to the memory array. An address buffer register also couples to the address sequencer. U.S. Pat. No. 5,587,962 provides a memory circuit which serves as a frame memory and permits special effects like zoom or split-screen and other effects to be performed efficiently. For that, the memory circuit represents a single-chip integrated circuit that contains $2^{20}$ bits of memory storage organized as 262,144 four bit wide words with special write and read access arrangements. The memory circuit generally operates in a serial access mode for both write and read operations, but has particular features which permit random access for writing or reading of the memory circuit on a limited scale. For receiving analog video signals converted to digital pixels, the memory circuit includes a serial pixel data input, which supplies four bits of data per pixel. The serial pixel data input couples to an input port of a write serial latch, and an output port of the write serial latch couples to an input port of a write register. An output port of the write register couples to a data input port of a memory array. The memory array is a dynamic random access memory array containing $2^{18}$ four bit memory locations. A data output port of the memory array couples to a data input port of a read register, and a data output port of a read register couples to a data input port of a read serial latch. The arbitration and control circuit passes an address generated by the address generator to the memory array so that the data may be written into the memory array, but a delay may occur due to refresh operations or read accesses to the memory array. Accordingly, the arbitration and control circuit may additionally contain storage devices so that addresses generated by address generators are not lost when immediate access to the memory array is blocked. U.S. Pat. No. 5,587,962 discloses a table-based solution. The solution is table-based because the whole sequence is stored on a DRAM memory array that is part of the frame memory circuit. As was noted above, the solution offers all the required flexibility in principle. However, this solution has the disadvantage that the size of the table must be relatively large. For example, an UXGA-based LCOS design has 1200 lines, so the table has to have 1200 entries of, in practice, 21 bit each, resulting in a table of about 25 kbits.

The object of the invention is provide a method of operating a driving circuit with a sequencer as described in the opening paragraph which has the flexibility of the above table-based sequencer but is less expensive.

Therefore, according to the invention, this method is characterized in that switching means operate the driving circuit alternately in a first mode wherein the address sequencer generates addresses for the video data in the memory by combining line pointers from a block of line pointers in address table register means with the output of pixel counting means and in a second mode wherein a block of line pointers from a full table of line pointers in said memory is downloaded into said address table register means.

As already mentioned, the invention further relates to a driving circuit for a display system wherein the method according to the invention is applied. This driving circuit comprises a memory for video data to be displayed and coupled thereto an address sequencer for controlling the sequence of writing and/or reading the video data in said memory, and is characterized in that the memory contains a full table of line pointers, each line pointer being part of a memory address for video data, and in that the address sequencer is provided with address table register means for a block of line pointers from said table of line pointers, means for successively updating the address table register means with subsequent blocks of line pointers, and pixel counting means, the output of which in combination with the consecutive line pointers from the address table register means determines the addresses for said video data Particularly, switching means are provided by which alternately memory addresses for video data are generated in a first mode in the address sequencer, and in a second mode the address table register is updated with a next block of line pointers. In a practical embodiment, the full table of line pointers for different sequences of video data to be displayed will be incorporated in the memory.

The invention also relates to an apparatus for displaying images comprising a display system and a driving circuit as described above.

The invention further relates to an algorithm for processing addresses in said driving circuit and said apparatus. The invention also relates to a computer program capable of running on signal processing means in said driving circuit, and to an information carrier containing said computer program.

These and other aspects of the invention will be apparent from and elucidated with reference to the embodiment described hereinafter, wherein FIG. 1 shows the system setup of a driving circuit for a display according to the invention in normal operation;

Figure 1:
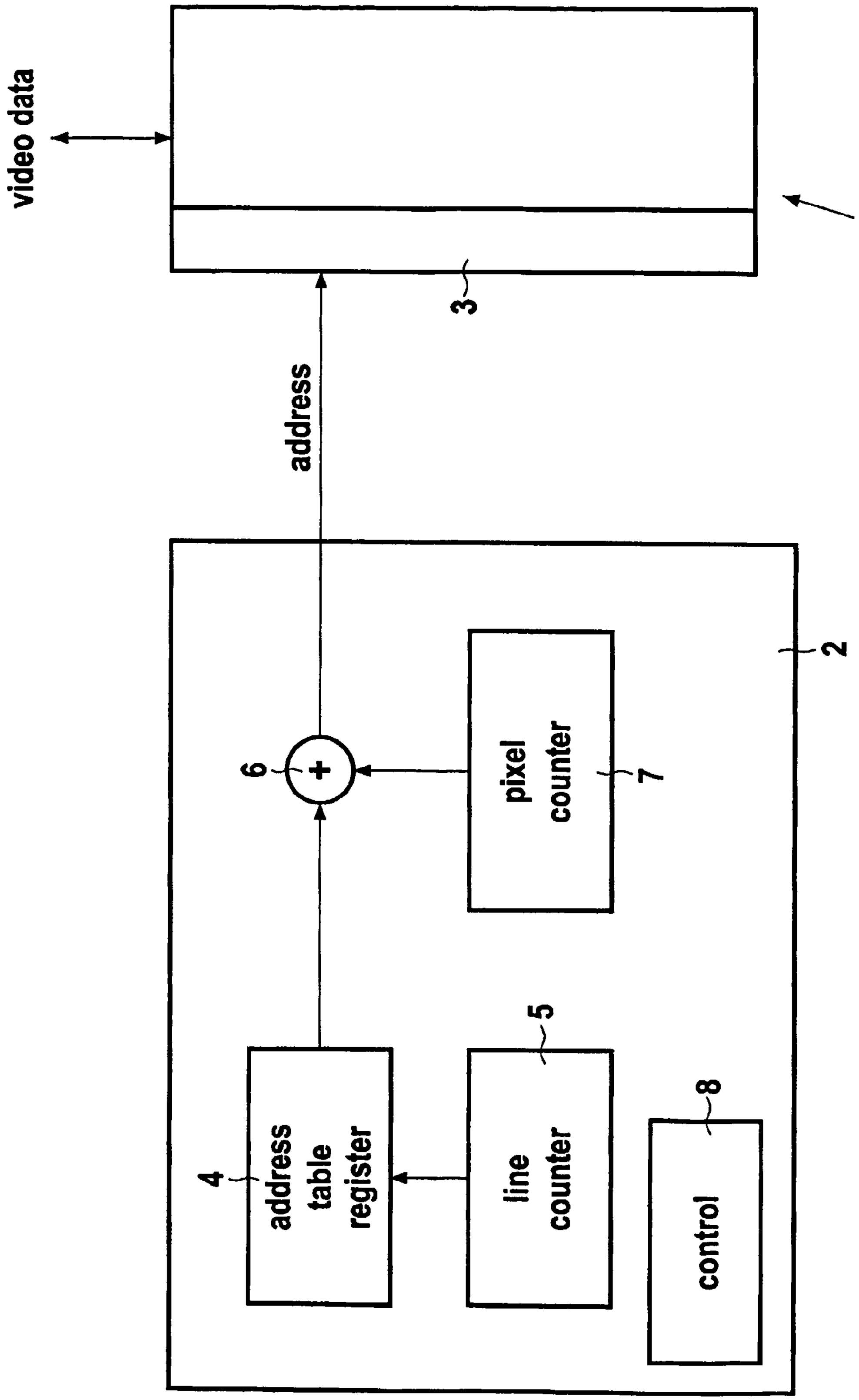

FIG. 1 shows the system setup of a driving circuit for a display in normal operation, comprising a main memory 1 and an address sequencer 2. The main memory 1 includes a frame memory 3. Video data is stored in the frame memory 3 in a first sequence and read out therefrom in a second sequence. The frame memory addresses, therefore, are generated by the address sequencer 2. In the present embodiment, the video data is formed by progressive video signals with one component, the luminance (Y) component, which signals for the sake of simplicity are supposed to be written sequentially and read out in an interlaced or color-sequential manner. Alternatively, an interlaced signal could be converted into a progressive signal by applying the present invention.

The address sequencer 2 is provided with an address table register 4 containing a table of line pointers. These line pointers form part of the frame memory addresses, indicating line addresses. During normal operation, consecutive line pointers are read out from the address table register 4 by a line counter 5 and supplied to a first input of an adder 6. A pixel counter 7 is coupled to the second input of the adder 6. The consecutive output signals of the adder 6 represent the frame memory addresses for the frame memory 3. The consecutive frame memory addresses determine the sequence in which video signals stored in the frame memory 3 are read out therefrom or the sequence in which video signals supplied to the frame memory 3 are stored therein.

If, for example, the system is used in combination with a display having 480 lines, the line counter 5 runs from 0 to 479; if one line contains 720 pixels, the pixel counter 7 runs from 0 to 719. If the address table register 4 contains 480 line addresses of usually 21 bits, a table of about 10 kbit will be necessary, which is relatively expensive. With a display of 1200 lines and an address table register 4 containing 1200 line addresses of 21 bits, a table of about 25 kbits will be necessary. According to the invention, the number of line pointers in the address table register 4 is limited, for example to 32; this results in an address table of about 0.7 kbit. So, the address table register 4 can only contain blocks of line pointers. This, however, requires a constant updating of the address table register 4; for reading out a frame of 480 lines the address table register 4 must be updated 15 times. To make this possible, all line pointers are stored in the main memory 1. Each time a block of line pointers is successively read out from the address table register 4, a next block of line pointers is transferred from the main memory 1 into the address table register 4. This process, the system setup for (line) address transfer, will be clarified with reference to FIG. 2. Both the system setup in normal operation and the system set up for address transfer occur under the control of a control processor 8 which forms part of the address sequencer 2.

Figure 2:
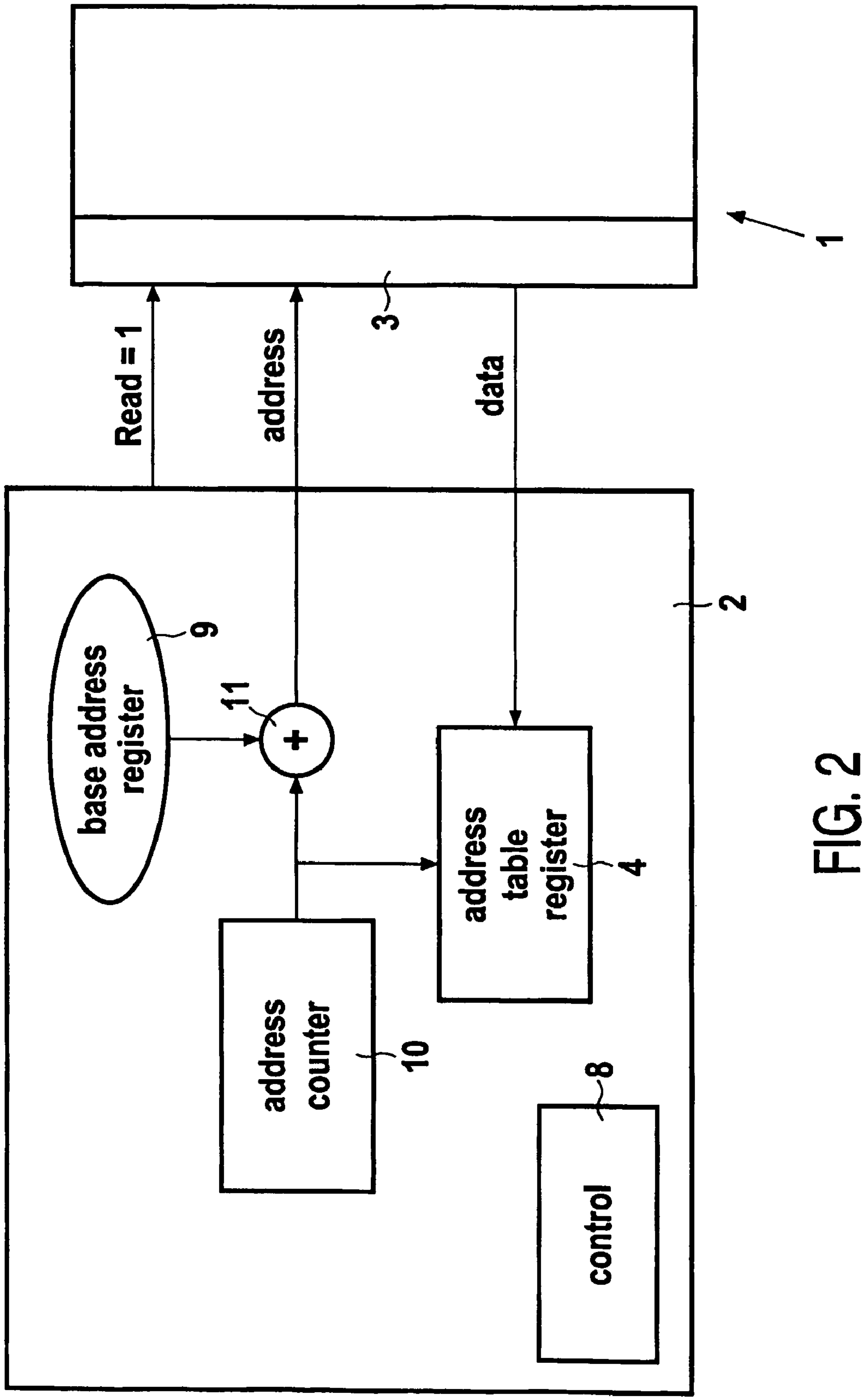
FIG. 2 shows the system setup of the driving circuit for address transfer.

FIG. 2 shows the system setup for address transfer. When the last line pointer of a block of lines pointers in the address table register 4 is read out, the address sequencer 2 reads a new block of line pointers from the main memory 1, i.e. a next block of line pointers is downloaded into the address table register 4. This requires a base address register 9, containing the base address or start address for a block of line pointers in the main memory 1, and an address counter 10. An adder 11 forms the addresses for the line pointers in the main memory 1 and supplies them thereto in the read mode (read=1 in FIG. 2) of the frame memory 3. These addresses represent an index for the line pointers in the frame memory 3. This index is as large as the number of lines of the display. In the write mode (read=0), the addressed line pointers are transferred to the address table register 4. So, the whole system is constantly switching between the table update mode and the address sequence mode (the normal mode).

Figure 3:
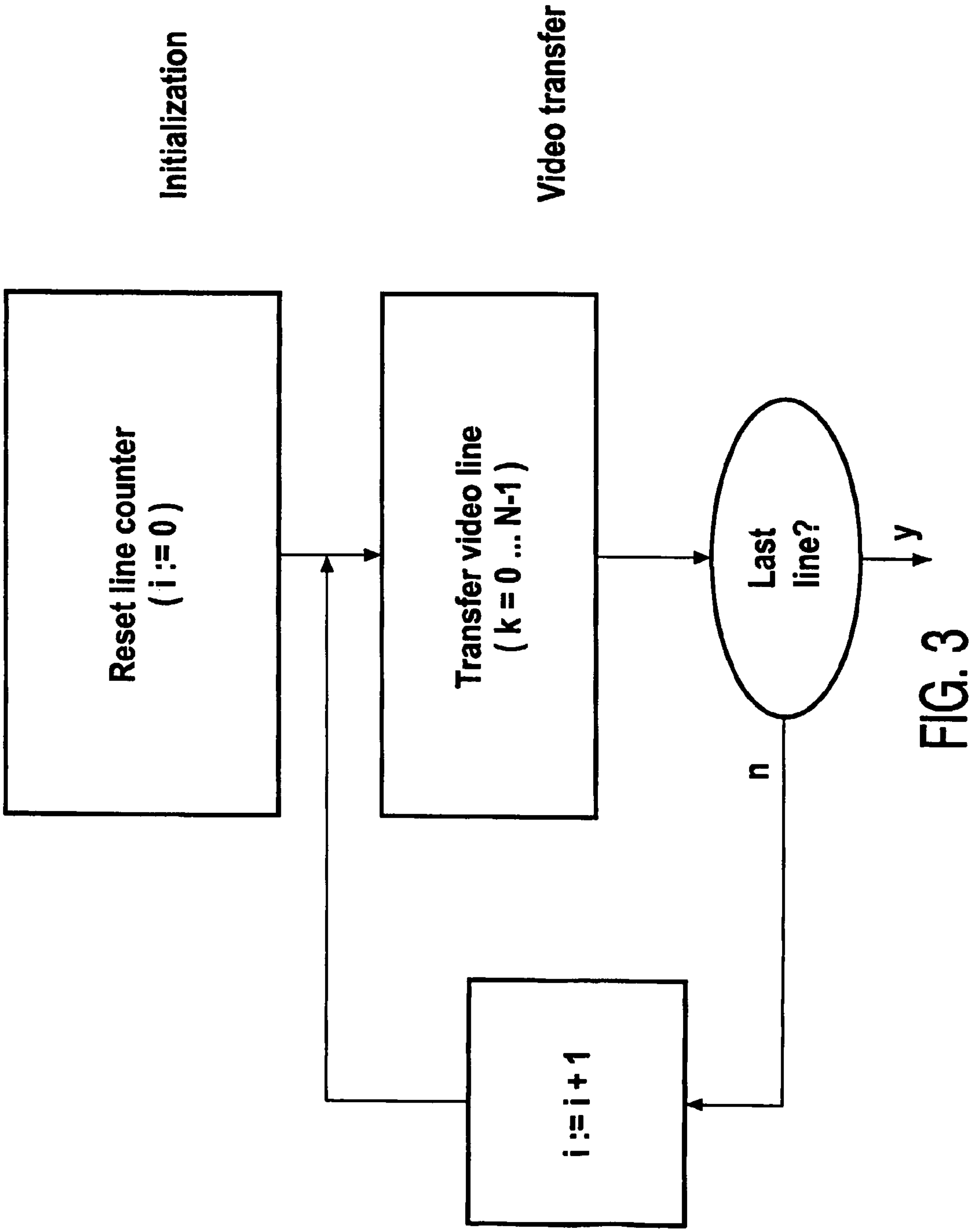
FIG. 3 shows a flow diagram for the method used during normal operation.

FIG. 3 shows the flow diagram for the method used during normal operation. During initialization the line counter 5 is reset to i=0. The next step is the generation of the consecutive frame memory or pixel addresses (k=0 . . . . N-1, wherein N is the number of pixels of a line) for a first line and the video data transfer realized by means of these addresses. Thereafter the line counter 6 is increased by 1 (i:=i+1) and the frame memory or pixel addresses for the next line are generated, realizing a corresponding video data transfer. This process continues until the frame memory or pixel addresses for the last line have been generated. When the last line is reached, the loop has finished.

Figure 4:
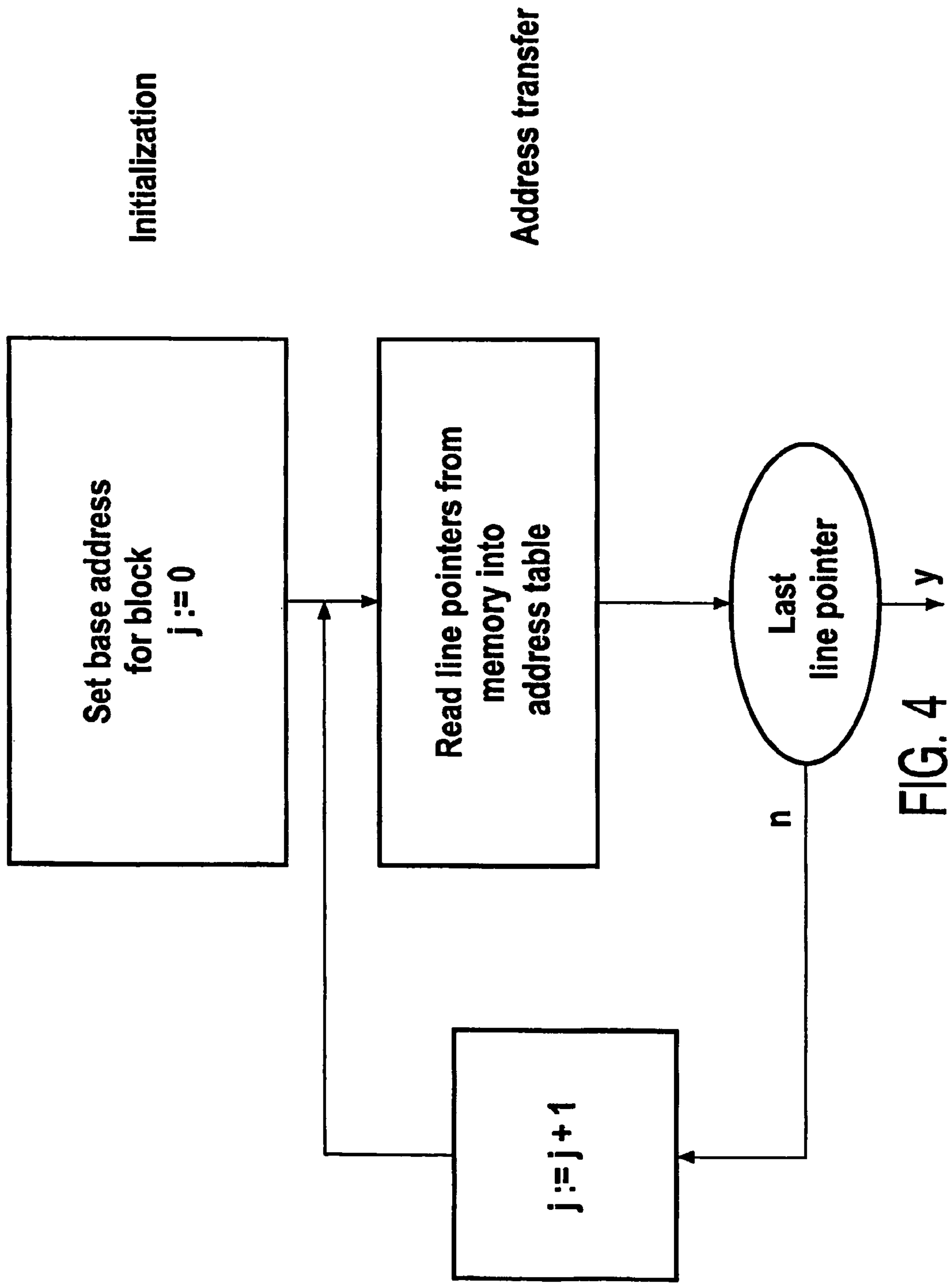
FIG. 4 shows a flow diagram for the method used during reading of a table block from the main memory into the address table register.

FIG. 4 shows the reading of a block of line pointers from the main memory 1 into the address table register 4. During initialization, the base address in the base address register 9 for a block of line pointers is reset to j=0. Then, during (line) address transfer, the line pointer corresponding to base address j=0 is read from the frame memory 1 into the address table register 4. Thereafter, the base address is successively increased by 1 (j:=j+1), and the corresponding line pointers are read from the main memory 1 into the address table register 4. This loop continues until the last line pointer of the block of line pointers has been downloaded into the address table register 4.

Figure 5:
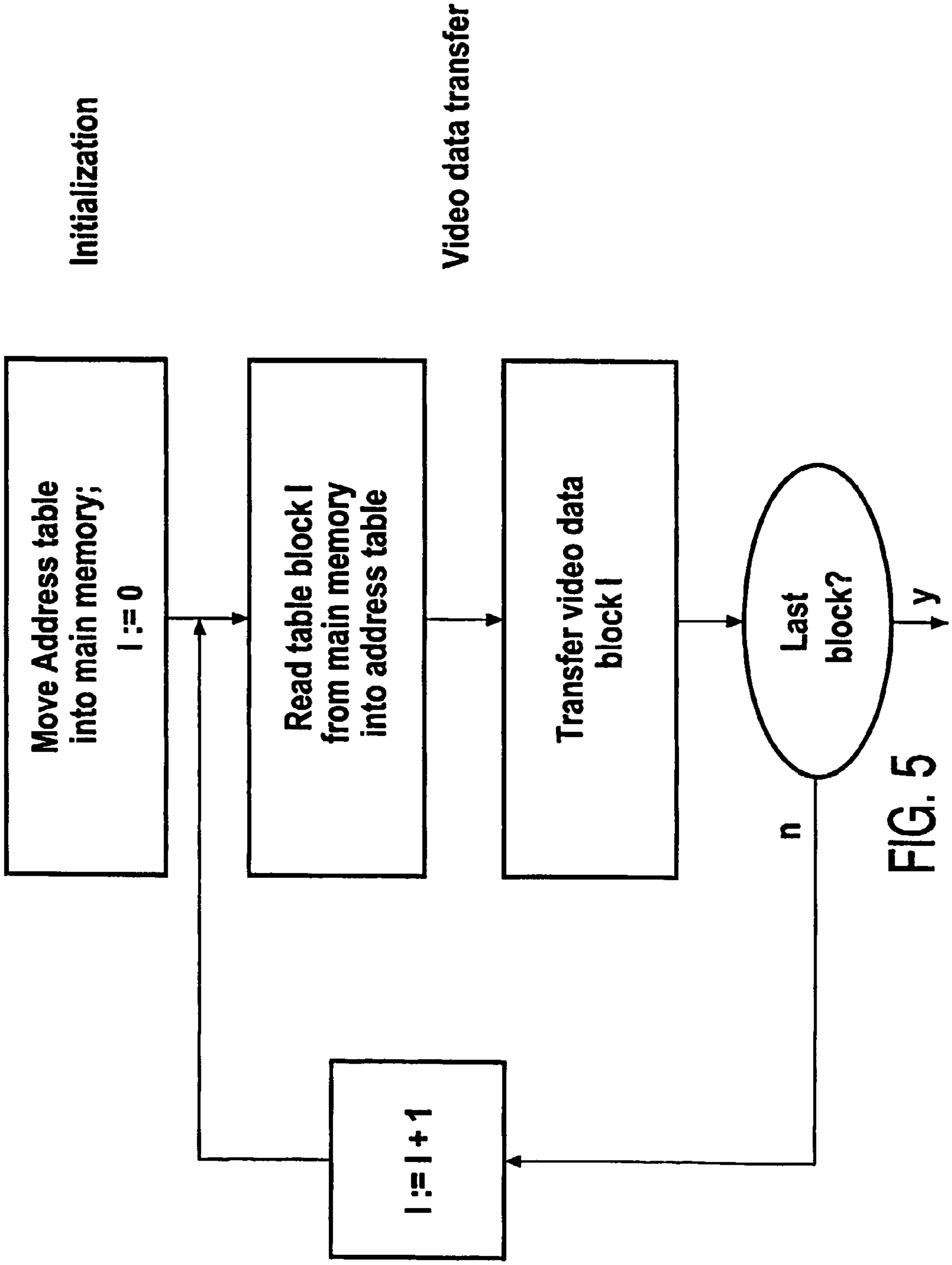
FIG. 5 shows a flow diagram for the method used, illustrating the repeatedly executed address table block transfer.

FIG. 5 shows the flow diagram for the method used, illustrating the repeatedly executed address table block transfer. During initialization, the block of line pointers in the address table register 4 is moved into the main memory 1, and the line counter 5 is reset to i=0. Then the loop for video data transfer starts. First block 1 is read from the main memory 1 into the address table register 4. Then video data corresponding to block 1 is transferred to the display. Thereafter, successively, next blocks of line pointers are downloaded, and the video data corresponding to these blocks are transferred. After the last block of line pointers has been downloaded and the corresponding video data has been transferred, the loop is finished.

Figure 6:
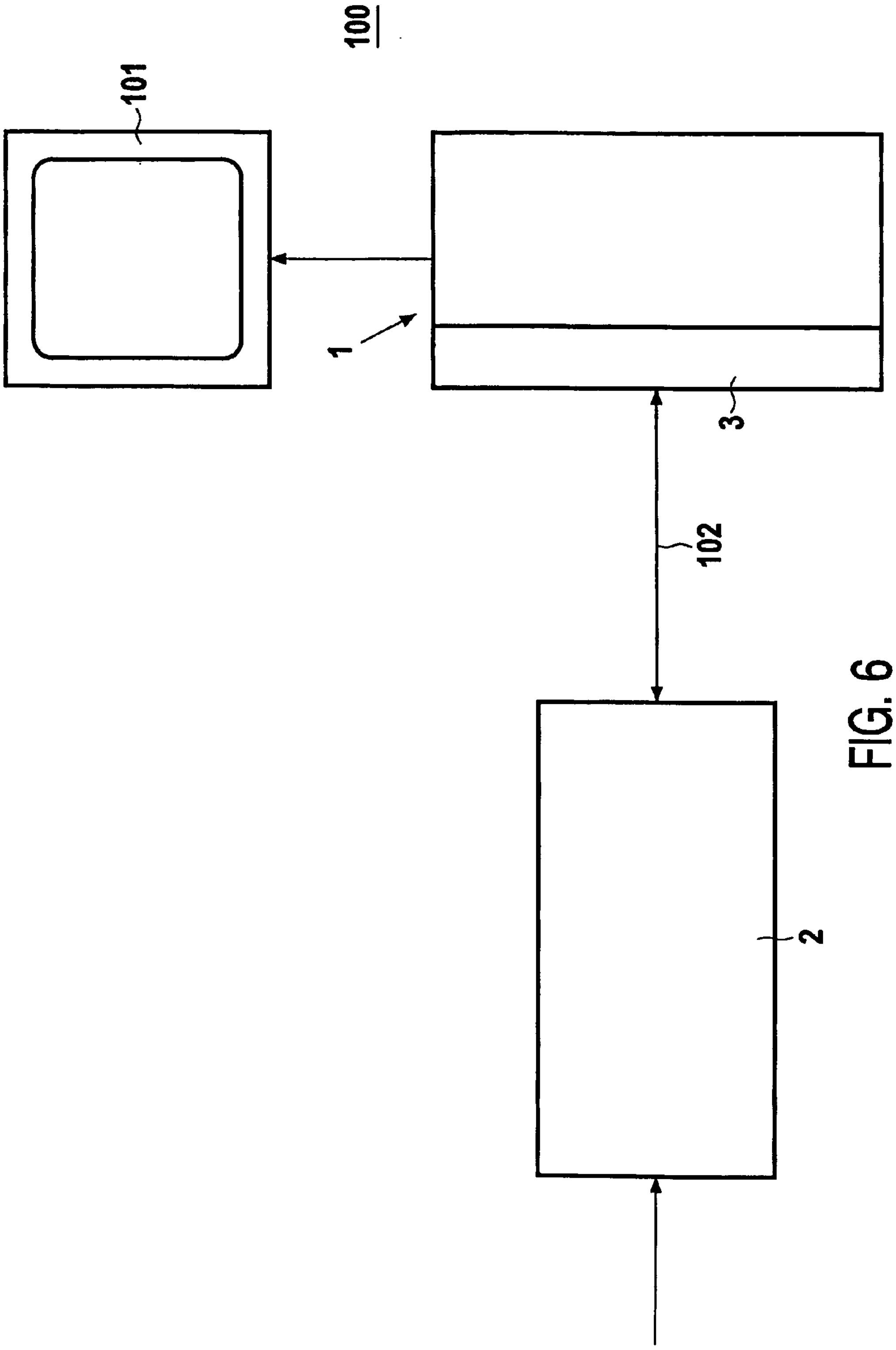
FIG. 6 shows an apparatus provided with a driving circuit according to the invention.

FIG. 6 shows an apparatus 100 for displaying images, comprising the driving circuit according to the invention. The apparatus 100 comprises a display 101, a main memory 1 with a frame memory 3, and an address sequencer 2. For example, the display 101 is chosen from the group consisting of CRT, PDP, and one-panel LCOS. The address sequencer 2 and the frame memory 3 are coupled for bidirectional data transfer, for example using a standard interface 102. The main memory 1 is also coupled to the display 101 for the transfer of video data.

The invention is not restricted to the preferred embodiment shown in the Figures. Modifications are possible. As was stated above, the address sequencer is composed of a picture line address part or line pointer and an address part for the pixels on a picture line. In the embodiment described, the line pointer relates to a full address line and the pixel address part to all the pixels of a picture line. However, it may also be possible that the line pointer relates to part of a picture line, for example half a picture line; in that case the pixel address part relates only to the pixels of half a picture line, too. Also, the line pointer may relate to more than one, for example two picture lines; in that case the pixel address part relates to the pixels of two picture lines.

The invention claimed is:

1. Method of operating a driving circuit for a display system, wherein the sequence of writing and/or reading video data into and/or from a memory is controlled by means of an address sequencer, each of the memory addresses for said video data generated in the address sequencer being composed of a picture line address part or line pointer and an address part for a pixel on said picture line, the method comprising:

storing a full table of line pointers for different sequences of video data to be displayed in the memory; and operating the driving circuit in an address sequence mode wherein the address sequencer generates addresses for the video data in the memory by combining line pointers that are read out by a line counter from a block of line pointers in address table register means with the output of a pixel counter using an adder, and in a table update mode wherein a block of line pointers from the full table of line pointers that is stored in said memory is downloaded into said address table register means, wherein operating the driving circuit in the table update mode includes:

setting a base address of the block of line pointers to zero;

reading a line pointer that corresponds to the base address of zero from the memory into the address table register means; and successively increasing the base address by one and reading the corresponding line pointer from the memory into the address table register means until the last line pointer of the block of line pointers is downloaded into the address table register means.

2. The method of claim 1, wherein operating the driving circuit in the address sequence mode includes:

setting the line counter to zero;

generating consecutive pixel addresses for video data that corresponds to the line counter of zero; and successively increasing the line counter by one and generating corresponding pixel addresses until the last line pointer of the block of line pointers is read out.

3. The method of claim 1, wherein operating the driving circuit in the address sequence mode includes:

setting the line counter to zero;

generating consecutive pixel addresses for video data that corresponds to the line counter of zero;

transferring the video data with the generated consecutive pixel addresses to the display; and successively increasing the line counter by one, generating corresponding pixel addresses, and transferring video data with the generated corresponding pixel addresses to the display until the last line pointer of the block of line pointers is read out.

4. The method of claim 1 further comprising moving the block of line pointers in the address table register means into the memory.

5. The method of claim 4 further comprising:

downloading a first block of line pointers from the memory into the address table register means;

transferring video data that corresponds to the first block of the line pointers to the display; and successively downloading next blocks of line pointers from the memory into the address table register means and transferring corresponding video data to the display until the last block of line pointers of the full table stored in the memory is downloaded from the memory into the address table register means.

6. Driving circuit for a display system comprising:

a memory for video data to be displayed and coupled thereto an address sequencer for controlling the sequence of writing and/or reading the video data in said memory, characterized in that the memory contains a full table of line pointers, each line pointer being part of a memory address for video data, and in that the address sequencer is provided with address table register means for a block of line pointers from said table of line pointers;

means for successively updating the address table register means with subsequent blocks of line pointers from the full table of line pointers that is contained in the memory, wherein the means for successively updating the address table register means with the subsequent blocks of line pointers is configured to set a base address of a block of line pointers to zero, to read a line pointer that corresponds to the base address of zero from the memory into the address table register means, to successively increase the base address by one and to read the corresponding line pointer from the memory into the address table register means until the last line pointer of the block of line pointers is downloaded into the address table register means;

a pixel counter, the output of which in combination with the consecutive line pointers that are read out by a line counter from the address table register means using an adder determines the addresses for said video data; and switching means, by which memory addresses for video data are generated in an address sequence mode in the address sequencer, and in a table update mode the address table register is updated with a next block of line pointers from the full table of line pointers that is contained in the memory.

7. Driving circuit as claimed in claim 6, characterized in that the memory comprises a full table of line pointers for different sequences of video data to be displayed.

8. Apparatus for displaying images comprising a display system and a driving circuit according to claim 6.

9. The driving circuit of claim 8 further comprising a computer readable storage medium that stores a computer program that runs on a signal processing means in the driving circuit.

10. The driving circuit of claim 6 further comprising a computer readable medium that stores a computer readable program embedded therein, said computer readable program capable of running on a signal processor in the driving circuit.

11. Driving circuit as claimed in claim 6, wherein the line counter is set to zero, consecutive pixel addresses for video data that corresponds to the line counter of zero are generated, and the line counter is successively increased by one and corresponding pixel addresses are generated until the last line pointer of the block of line pointers is read out.

12. Driving circuit as claimed in claim 6, the line counter is set to zero, consecutive pixel addresses for video data that corresponds to the line counter of zero are generated, the video data with the generated consecutive pixel addresses is transferred to the display, the line counter is successively increased by one, corresponding pixel addresses are generated, and video data with the generated corresponding pixel addresses is transferred to the display until the last line pointer of the block of line pointers is read out.

13. Driving circuit as claimed in claim 6, wherein a block of line pointers in the address table register means is moved into the memory.

14. Driving circuit as claimed in claim 13, wherein a first block of line pointers is downloaded from the memory into the address table register means, video data that corresponds to the first block of the line pointers is transferred to the display, and next blocks of line pointers are successively downloading from the memory into the address table register means and corresponding video data is transferred to the display until the last block of line pointers of the full table contained in the memory is downloaded from the memory into the address table register means.

15. Driving circuit for a display system comprising:

a memory for video data to be displayed and coupled thereto an address sequencer for controlling the sequence of writing and/or reading the video data in said memory, characterized in that the memory contains a full table of line pointers for different sequences of video data to be displayed, each line pointer being part of a memory address for video data, and in that the address sequencer is provided with address table register means for a block of line pointers from said table of line pointers;

means for successively updating the address table register means with subsequent blocks of line pointers from the full table of line pointers that is contained in the memory, wherein the means for successively updating the address table register means with the subsequent blocks of line pointers is configured to set a base address of a block of line pointers to zero, to read a line pointer that corresponds to the base address of zero from the memory into the address table register means, to successively increase the base address by one and to read the corresponding line pointer from the memory into the address table register means until the last line pointer of the block of line pointers is downloaded into the address table register means; and a pixel counter, the output of which in combination with the consecutive line pointers that are read out by a line counter from the address table register means using an adder determines the addresses for said video data.

16. Driving circuit as claimed in claim 15, wherein the line counter is set to zero, consecutive pixel addresses for video data that corresponds to the line counter of zero are generated, and the line counter is successively increased by one and corresponding pixel addresses are generated until the last line pointer of the block of line pointers is read out.

17. Driving circuit as claimed in claim 15, wherein a block of line pointers in the address table register means is moved into the memory.

18. Driving circuit as claimed in claim 17, a first block of line pointers is downloaded from the memory into the address table register means, video data that corresponds to the first block of the line pointers is transferred to the display, and next blocks of line pointers are successively downloading from the memory into the address table register means and corresponding video data is transferred to the display until the last block of line pointers of the full table contained in the memory is downloaded from the memory into the address table register means.

* * * * *